United States Patent
Jiang et al.

(10) Patent No.: US 6,511,859 B1
(45) Date of Patent: Jan. 28, 2003

(54) IC-COMPATIBLE PARYLENE MEMS TECHNOLOGY AND ITS APPLICATION IN INTEGRATED SENSORS

(75) Inventors: Fukang Jiang, Pasadena, CA (US); Zhigang Han, Pasadena, CA (US); Xuan-Qi Wang, Thousand Oaks, CA (US); Yu-Chong Tai, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/523,399

(22) Filed: Mar. 10, 2000

Related U.S. Application Data

(60) Provisional application No. 60/124,247, filed on Mar. 12, 1999.

(51) Int. Cl.[7] .............................................. H01L 21/00
(52) U.S. Cl. ............................. 438/48; 438/24; 438/50; 438/52; 438/53; 438/691; 438/619; 438/635

(58) Field of Search .............................. 438/24, 48, 50, 438/52, 53, 691, 619, 635, 702, 106, 108, 114; 216/79; 156/643; 257/419

(56) References Cited

U.S. PATENT DOCUMENTS

| | | | |
|---|---|---|---|
| 4,310,380 A | | 1/1982 | Flamm et al. |
| 4,621,411 A | | 11/1986 | Havemann et al. |
| 4,987,101 A | | 1/1991 | Kaanta et al. |
| 5,326,726 A | | 7/1994 | Tsang et al. |
| 5,332,469 A | * | 7/1994 | Mastrangelo ............... 156/643 |
| 5,798,283 A | | 8/1998 | Montague et al. |
| 5,963,788 A | | 10/1999 | Barron et al. |
| 6,060,336 A | | 5/2000 | Wan |
| 6,069,392 A | * | 5/2000 | Tai et al. ..................... 257/419 |
| 6,162,367 A | * | 12/2000 | Tai et al. ...................... 216/79 |

* cited by examiner

Primary Examiner—Matthew Smith
Assistant Examiner—Belur V. Keshavan
(74) Attorney, Agent, or Firm—Fish & Richardson, PC

(57) ABSTRACT

A combined IC/Mems process forms the IC parts first, and then forms the MEMS parts. One option forms a parylene overlayer, then forms a cavity under the parylene overlayer.

14 Claims, 4 Drawing Sheets

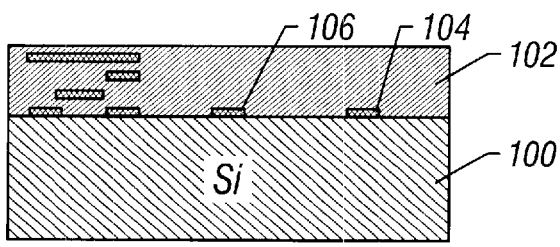
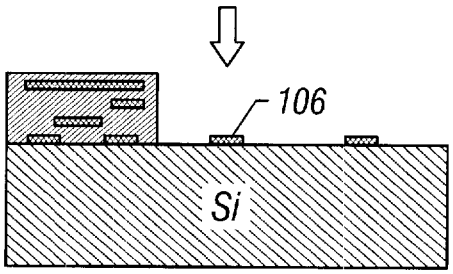
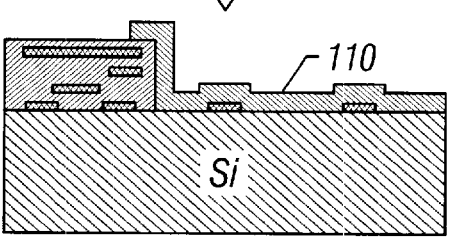
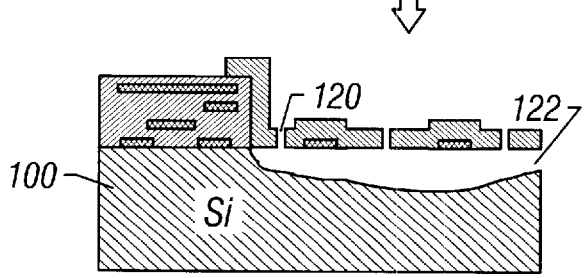
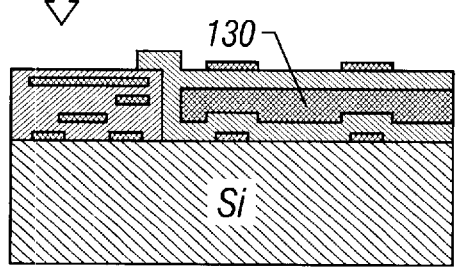
MULTI-LAYERS OF PARYLENE, PR, METAL CAN BE ADDED ON
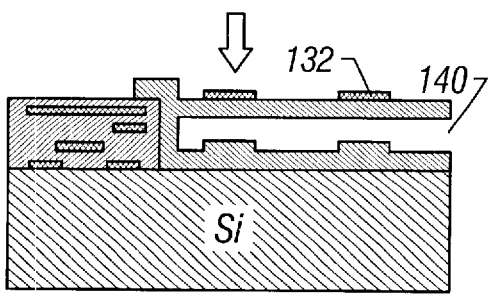
FIG. 1A
FIG. 1B
FIG. 1C
FIG. 1D
FIG. 1E
FIG. 1F

IC-COMPATIBLE PARYLENE MEMS TECHNOLOGY AND ITS APPLICATION IN INTEGRATED SENSORS

This application claims benefit of U.S. Provisional application No. 60/124,247, filed Mar. 12, 1999.

U.S. Government may have certain rights in this invention pursuant to AFOSR Grant no. F49620-97-1-0514.

BACKGROUND

Microelectronic, or MEMS, devices often form structures using semiconductor material. Integrated Circuit or ("IC") technologies form electronic structure using that same material. Certain applications make it desirable to integrate MEMS devices with integrated circuit electronics on a single substrate.

The prior art has taught making these units in certain ways. A first way processes the IC part first. The MEMS process is then formed onto the semi-finished IC wafer.

The MEMS process must have certain compatibilities, in order to avoid attacking the functionality of an electronic circuit. One primary concern is with operating temperature. All post-IC electronic processes typically need to be done below 400° C.: the maximum temperature for aluminum in electronic connections. This eliminates many of the common MEMS structural materials, such as LPCVD silicon nitride and polysilicon deposition; both of which have been typically done above 400° C. Therefore, this IC processing system was often used for devices which did not require certain IC dielectrics like polysilicon or metalization layers.

Moreover, many IC foundries do not have processes for mechanical material properties. These foundries focus on producing reliable electronic circuits, as compared with structural processes. As such, these microstructures can have residual stresses and stress gradients. Equally problematic is that the characteristics may vary from run to run.

MEMS devices can form microstructures with various film thicknesses and high aspect ratios. However, the vertical dimensions of the IC layers are often fixed in advance, in order to optimize the IC design. This in turn can limit MEMS design parameters. For example, in order to make free-standing MEMS structures, vertical stress gradients due to the composite nature of the structures can cause curling out of the plane of the substrate.

In a mixed semiconductor/MEMS process, the MEMS processing can be carried out first, or an interweaved process is known in which parts of each are carried out alternately. However, due to the incompatibility of most MEMS materials with the IC processes, this can be difficult.

SUMMARY

According to the techniques disclosed herein, more complex, reliable, and economic integrated circuits can be formed by special techniques described herein.

BRIEF DESCRIPTION OF THE DRAWINGS

These and other aspects will now be discussed with reference to the accompanying drawings, wherein:

FIGS. 1a–1f show a CMOS integrated circuit formation process which adds MEMS structures;

DETAILED DESCRIPTION

Figure 2:
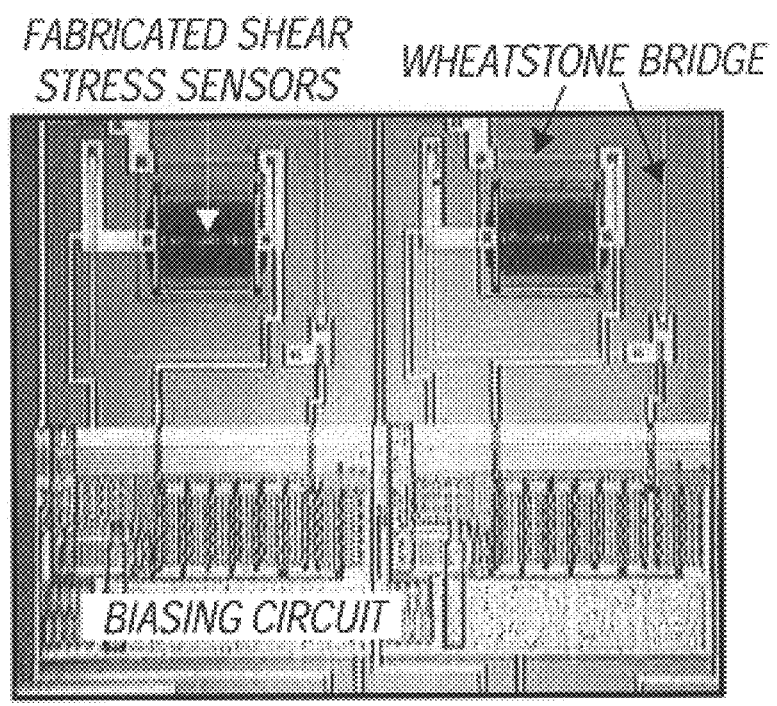
FIG. 2 shows an array of shear stress sensors.

The present application describes using special MEMS materials along with a semiconductor process.

A specific material used is parylene, deposited after formation of the semiconductor structure, also called "post-deposited parylene". The parylene is used as a MEMS structural element. The parylene can be used along with photoresist, sputtered or low temperature-evaporated metals. A sacrificial material, such as amorphous silicon can also be used. In a disclosed mode, gas phase bromine trifluoride is used as a isotropic silicon etchant. The structure is etched in such a way to form a cavity under the parylene layer, and such that the parylene layer forms a structural part.

Chemical vapor deposited ("CVD") parylene has a thickness that can range between submicrons, and more than 20 microns. This thickness ratio is desirable to enable formation of high aspect ratio microstructures. The combined post-IC process operates around room temperature and also on wafer scale substrates using standard lithography.

Also disclosed herein is an integrated shear stress sensor using a hot wire operating element.

The formation process is shown in FIGS. 1a–1f. FIG. 1a shows a CMOS wafer that is fabricated by an industrial foundry. This includes a silicon substrate 100, and a dielectric layer 102 which has certain semiconductor structures thereon. These structures may include a conductive line 104 which can be aluminum, and can include one or more polysilicon structures 106.

The structures are then patterned and etched in FIG. 1b. The dielectric passivation layer of the IC wafer is patterned and etched by combining reactive ion dry etching and buffered hydrofluoric wet etching. This forms semiconductor layers 106 which are patterned to include some, but a reduced amount, of dielectric material.

A first layer of parylene 110 is deposited as shown in FIG. 1c. This first layer of parylene has enhanced adhesion. In one disclosed mode, the parylene can be parylene-N also called poly-para-xylylene. This thin film polymer can be conformally deposited at room temperature at a pressure of 0.1 Torr. The parylene forms a good mechanical material for forming the MEMS structures. The MEMS structures can have smaller Young's modulus and intrinsic stress as compared with an LPCVD silicon nitride.

The parylene is then further processed to form a cavity. This can be done in one of two different ways.

A first processing technique is shown in FIG. 1d. The structure is patterned using an oxygen plasma, to form etching holes as shown in FIG. 1d. The etching holes 120 can also be freed from the substrate, to form the gap 122. The etching can use $BrF_3$ or $XeF_2$. The cavity 120 underneath the parylene structure is used in making micro-sized beams, membranes, and diaphragms. Hence, in summary, this first technique etches away part of the silicon substrate 100 below the part having semiconductor structures thereon ("the active part"), leaving an opening beneath the active part.

The silicon etching step requires controllable selectivity over the CMOS dielectric layers, aluminum and parylene. It also requires maintaining the integrity of the parylene-substrate interface.

The inventors found that $BrF_3$ and $XeF_2$ gas phase etching produce certain advantages when doing this. First, since the etching of the silicon is carried out as a dry etching, the micromachining meniscus force is mostly obviated. This is mostly done without plasma, so the possible damage to the electronic circuitry is minimized. It was also found that $BrF_3$ does less damage to the parylene-substrate interface than do many wet etching agents.

A second processing technique to form alternative microstructures is shown in FIGS. 1e and 1f. These difficult-to-form microstructures can be formed by using a sacrificial layer between two structural layers, and then removing the sacrificial layer.

The sacrificial layer can include photoresist-sputtered metal, or amorphous silicon. Photoresist is easily applied and etched away using acetone at room temperature. Therefore photoresist forms a sacrificial layer that has certain advantages.

FIG. 1e shows photoresist 130 being used as a sacrificial layer. The layer is removed to form cavity 140 shown in FIG. 1f. Additional layers of metal 132, or other materials, can then be added. In addition, as shown by step 145, the composite layer deposition can be repeated to form additional layers.

This process produces significantly improved results, as demonstrated by the embodiment which shows forming a parylene membrane shear stress sensor on a single substrate.

Active control of boundary layer turbulent flows over a large surface often require distributed sensing actuation and control. MEMS devices are often used for this purpose. Wafer scale integration of the MEMS devices with IC electronics can facilitate this operation. The present shear stress device forms using the above-described IC-add-on process using parylene N as the sensor diaphragm material, and using $BrF_3$ etching as the means to free the diaphragm. Parylene and $BrF_3$ etching has significant advantages. This forms a hot film shear stress sensor with a small heat loss to the substrate. It also forms a diaphragm cavity structure in the post-IC process.

Figure 3:
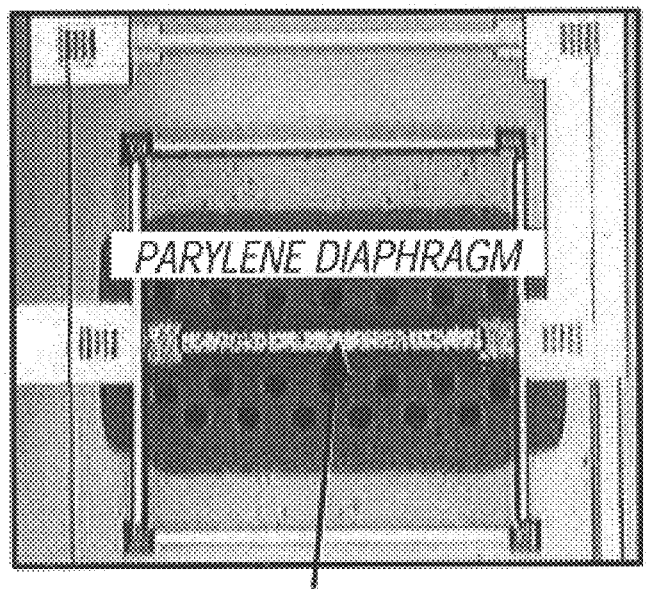
FIG. 3 shows a close up of the shear stress sensor.

The diaphragm cavity structure is shown in FIGS. 2 and 3. FIG. 2 shows an array of shear stress sensors 200 with an on chip biasing circuit 210 and a number of bridges 220. A close up of the shear stress sensor 200 is shown in FIG. 3. This includes a parylene diaphragm 310 with a poly sensor 320 integrated therein. The formation process is shown herein with respect to FIGS. 4A–4D.

Figure 4A:
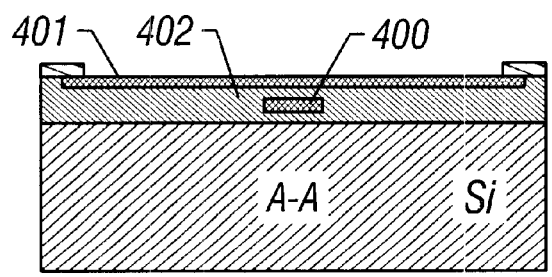
FIGS. 4A–4D show details of the formation process.

First, in FIG. 4A, the electrical structure such as the biasing circuit 210, amplifying circuits, and other circuits are fabricated using a MITEL, 2 micron double-poly double-metal IC process. A gate poly structure of 3225 Å thick, 20 Ohms/sq, 0/1%° C. TCR is also used as the hot wire sensing element, on top of the gate oxide. The aluminum layer also forms an etch stop for the passivation layer opening.

A polysilicon gate 400 is surrounded by insulation 402 and covered by an aluminum wiring layer 404.

Figure 4B:
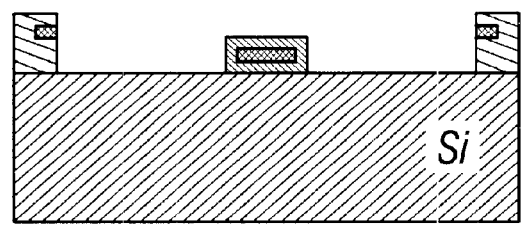

FIG. 4B shows etching away parts of the aluminum and insulator, to leave a partial structure.

Figure 4C:
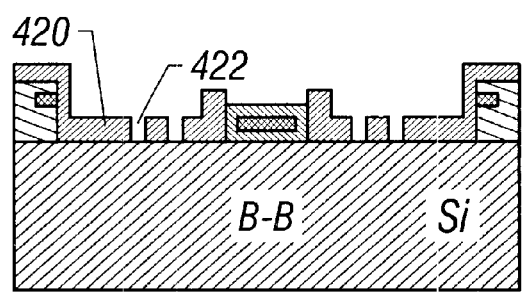

In FIG. 4C, the parylene N is deposited as layer 420. This layer can be deposited at 0.1 Torr. Openings 422 are formed as described above.

Figure 4D:
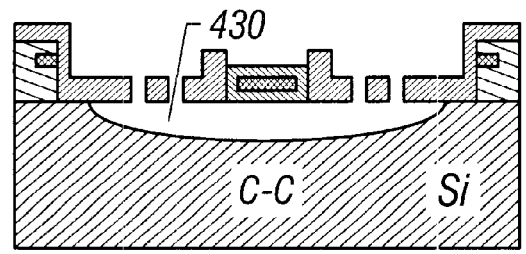

Finally, as shown in FIG. 4D, a cavity 430 is formed, leaving an opening below the semiconductor elements.

Figure 5:
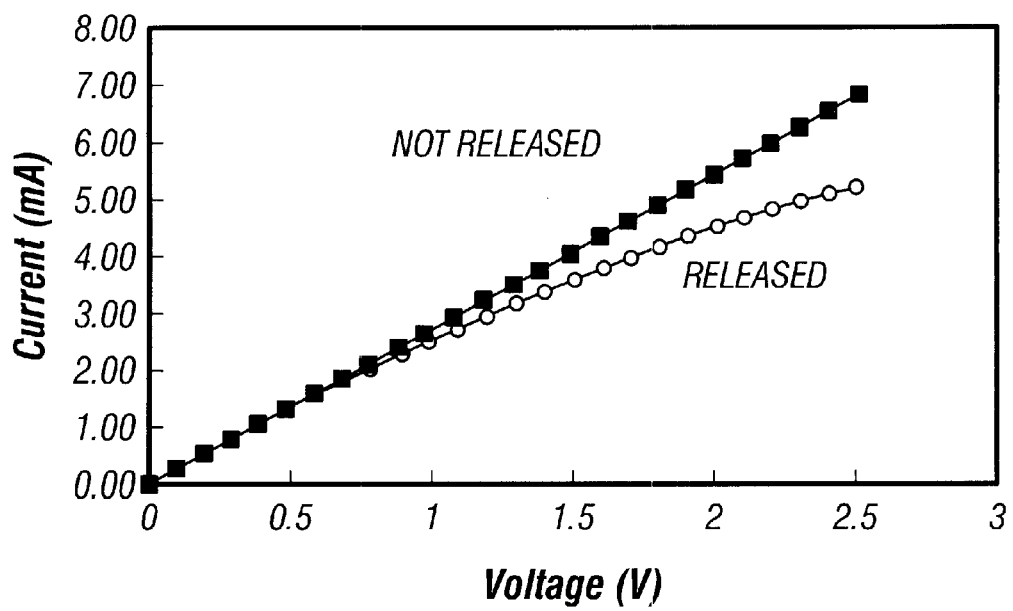
FIG. 5 shows voltage to current transfer curves of the poly elements, before and after their release from the substrate.

The voltage to current transfer curves of the poly elements, before and after their release from the substrate, are shown in FIG. 5. This clearly shows the heating effects of the freed sensor element due to the successful reduction of the conductive heat loss through the substrate and the diaphragm. Each integrated sensor has elements arranged in a Wheatstone bridge configuration in order to achieve an automatically biased 10% overheat ratio.

Figure 6:
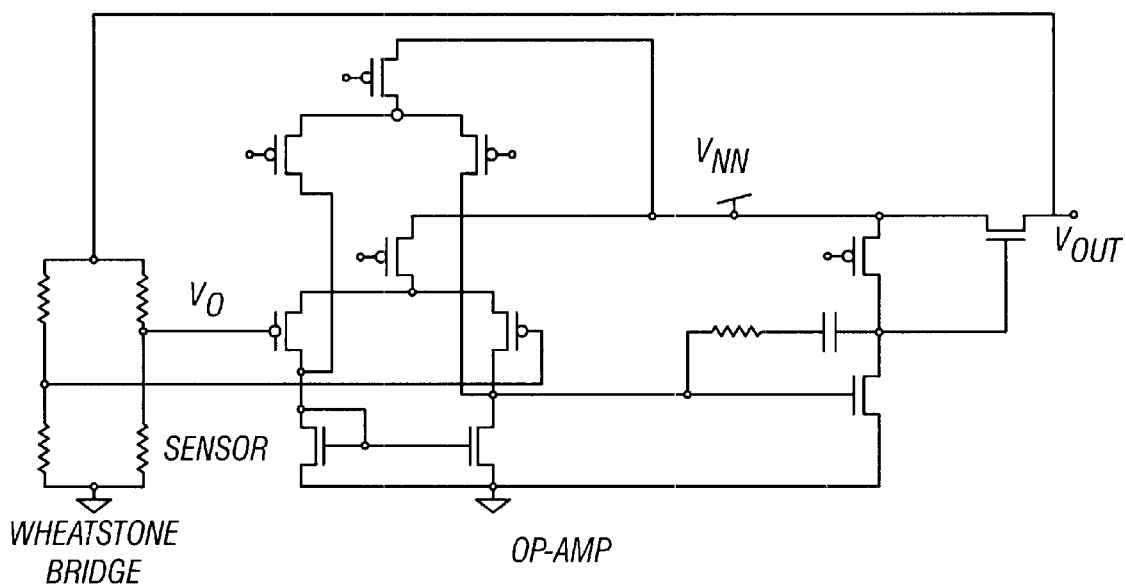
FIG. 6 shows a schematic of the biasing circuit which is used and the Wheatstone bridge in the shear stress sensors.

FIG. 6 shows a schematic of the biasing circuit which is used and the Wheatstone bridge.

Although only a few embodiments have been disclosed above, other modifications are possible.

What is claimed is:

1. A method of forming a structure, comprising:
   obtaining a semiconductor structure on a semiconductor substrate with multiple semiconductor layers;
   forming a structural portion over the semiconductor structures, said structural portion including parylene; and
   etching an opening which leaves said parylene structure and semiconductor structure intact and unsupported by other structural elements other than said parylene structure and said semiconductor substrate.

2. The method of claim 1 wherein said etching an opening comprises etching a hole under the structure using bromine trifluoride etching.

3. The method as in claim 1, wherein said etching an opening comprises forming a sacrificial layer, and removing said sacrificial layer.

4. The method of claim 3, wherein said sacrificial layer includes photoresist.

5. The method of claim 3, wherein said sacrificial layer includes amorphous silicon.

6. The method of claim 1, wherein said parylene is poly-para-xylylene.

7. The method of claim 1, wherein said etching uses a gas phase etchant.

8. A method of forming a structure, comprising:
   first forming a semiconductor structure on a substrate;
   after forming said semiconductor structure, forming a parylene structural element, coupled to at least part of said semiconductor structure, and physically supporting said semiconductor structure; and
   etching away said substrate in at least one location so that said semiconductor structure is supported only by said parylene.

9. The method of claim 8, wherein said semiconductor structure includes a dielectric portion formed of parylene.

10. The method of claim 8, wherein said parylene structural element supports a wall of a cavity.

11. The method of claim 8, wherein said parylene is used along with photoresist.

12. The method of claim 8, further comprising etching using a gas phase etchant.

13. The method of claim 12, wherein said gas phase etchant is gas phase bromine trifluoride used as a isotropic silicon etchant, used to form a cavity under the parylene layer.

14. A device, comprising:
   an electrical structure including a biasing circuit, amplifying circuit, and at least one other circuits formed using an integrated circuit process, on a semiconductor substrate;
   a polysilicon gate, associated with said electrical structure; and
   a parylene structural element, associated with said electrical structure, and covering an opening below the electrical structure and supports the electrical structure relative to the opening.

\* \* \* \* \*